United States Patent
Hofmeister

(12) United States Patent (10) Patent No.: US 6,960,057 B1
Hofmeister (45) Date of Patent: Nov. 1, 2005

(54) SUBSTRATE TRANSPORT APPARATUS

(75) Inventor: Christopher A. Hofmeister, Hampstead, NH (US)

(73) Assignee: Brooks Automation, Inc., Chelmsford, MA (US)

(*) Notice: Subject to any disclaimer, the term of this patent is extended or adjusted under 35 U.S.C. 154(b) by 643 days.

(21) Appl. No.: 09/163,844

(22) Filed: Sep. 30, 1998

(51) Int. Cl.$^7$ ............................................. B25J 9/00
(52) U.S. Cl. ........................... 414/744.5; 74/490.01; 414/744.6; 414/806; 414/810; 414/939
(58) Field of Search ............... 414/744.5, 744.6, 414/226.05, 222.01, 935, 939, 800, 805, 414/806, 810, 811, 744.01; 74/490.01

(56) References Cited

U.S. PATENT DOCUMENTS

| | | | |
|---|---|---|---|
| 4,715,921 A | 12/1987 | Maher et al. | ............... 156/345 |
| 4,781,512 A * | 11/1988 | Ohta et al. | ............. 414/226.03 |
| 5,314,293 A * | 5/1994 | Carlisle et al. | ........... 414/744.5 |
| 5,404,894 A | 4/1995 | Shiraiwa | ...................... 134/66 |
| 5,431,529 A | 7/1995 | Eastman et al. | .......... 414/744.5 |
| 5,512,320 A | 4/1996 | Turner et al. | ................ 427/255 |
| 5,513,946 A * | 5/1996 | Sawada et al. | ........... 414/744.5 |
| 5,611,655 A * | 3/1997 | Fukasawa et al. | .......... 414/939 |
| 5,741,113 A * | 4/1998 | Bacchi et al. | ................ 414/935 |
| 5,765,983 A | 6/1998 | Caveney et al. | ............. 414/217 |
| 5,789,890 A * | 8/1998 | Genov et al. | ........ 414/744.1 X |

* cited by examiner

*Primary Examiner*—Donald W. Underwood
(74) *Attorney, Agent, or Firm*—Perman & Green, LLP; Richard Pickreign

(57) ABSTRACT

A substrate transport apparatus comprising a drive section and a robot transport arm. The robot transport arm is mounted to the drive section. The robot transport arm has a wrist and an end effector to hold the substrate thereon. The end effector is rotatably mounted to the wrist to rotate about the wrist. The rotation of the end effector about the wrist is slaved to the robot transport arm. The robot transport arm is adapted to transport substrates into and out of two general side-by-side orientated substrate holding areas with the drive section being located in only one location relative to the two holding areas.

10 Claims, 6 Drawing Sheets

SUBSTRATE TRANSPORT APPARATUS

BACKGROUND OF THE INVENTION

1. Field of the Invention

The present invention relates to a substrate transport apparatus and, more particularly, to a robot transport arm of a substrate transport apparatus.

2. Prior Art

Various types of substrate transport apparatus are known in the prior art. Examples of substrate transport apparatus are described in U.S. Pat. Nos. 5,404,894; 5,431,529 and 5,765, 983.

SUMMARY OF THE INVENTION

In accordance with a first embodiment of the present invention, a substrate transport apparatus is provided. The substrate transport apparatus comprises a drive section and a robot transport arm. The robot transport arm is mounted to the drive section. The robot transport arm has a wrist and an end effector to hold a substrate thereon. The end effector is rotatably mounted to the wrist, to rotate about the wrist. Rotation of the end effector about the wrist is slaved to the robot transport arm. The robot transport arm is adapted to transport substrates into and out of two generally side-by-side orientated substrate holding areas. The drive section is located in only one location relative to the holding areas.

In accordance with a second embodiment of the present invention, a substrate processing apparatus is provided. The substrate processing apparatus comprises a frame with a plurality of side-by-side substrate storage areas and a robot transport arm pivotably mounted to the frame. The robot transport arm transports substrates between the substrate storage areas and a substrate holding area. The robot transport arm has an end effector and a wrist. The end effector is pivotably mounted to the wrist of the robot transport arm. The robot transport arm is adapted to substantially rectilinearly move substrates into and out of at least two of the plurality of side-by-side substrate storage areas along axes of translation corresponding to each of the two substrate storage areas. An axis about which the robot transport arm pivots relative to the frame stays in one location relative to the frame when the robot transport arm moves substrates into and out of each of the two substrate storage areas. The end effector of the robot transport arm is slaved to the robot transport arm to rotate automatically about the wrist when the robot transport arm moves substrates into and out of each of the substrate storage areas.

In accordance with a first method of the present invention, a method for transporting a substrate into and out of a substrate holding area on a substrate processing apparatus is provided. The method comprises the steps of providing the substrate on an end effector of a transport arm, rotating the transport arm and moving the transport arm. The transport arm is rotated about an axis of rotation at a shoulder of the transport arm in order to rotate the wrist about the axis of rotation. The transport is moved to radially displace the wrist of the transport arm relative to the axis of rotation at the shoulder of the transport arm. The step of moving the transport arm rotates the end effector about the wrist to rotate the substrate about the axis of rotation at the shoulder of the transport arm in concert with rotation of the wrist about the axis of rotation at the shoulder of the transport arm.

In accordance with a third embodiment of the present invention, a substrate transport apparatus is provided. The substrate transport apparatus comprises a robot transport arm, means for rotating the robot transfer arm, means for linearly displacing the end effector of the robot transport arm and a controller. The robot transport arm has an end effector to hold a substrate thereon. The means for rotating the robot transport arm rotate the arm about a first axis of rotation. The means for rotating the robot arm comprise a first drive mechanism being drivingly connected to the robot transport arm to rotate the robot transport arm as a unit about the axis of rotation. The means for displacing the end effector comprise a second driving mechanism drivingly connected to the robot transport arm to substantially radially displace the end effector relative to the axis of rotation. The controller controls the means for rotating the robot transport arm and the means for displacing the end effector to provide compound rotation, of the robot transport arm about the axis of rotation, with radial displacement of the end effector relative to the axis of rotation. The compound rotation of the robot transfer arm and radial displacement of the end effector result in general rectilinear translation of the substrate into and out of a substrate holding chamber.

In accordance with a second method of the present invention, a method for transporting a substrate into and out of a substrate holding area is provided. The method comprises the steps of providing the substrate on an end effector of a transport arm, rotating the transport arm as a unit about an axis of rotation and moving the end effector of the transport arm. The end effector is moved to radially displace the end effector relative to the axis of rotation. The step of moving the end effector complements the step of rotating the transport arm about the axis of rotation to result in the substrate being substantially rectilinearly translated into and out of the substrate holding area.

In accordance with a third method of the present invention, a method for transporting substrates into and out of a substrate holding chamber. The method comprises the steps of placing an end effector on a transport arm in a first position, moving the end effector between the first position and a second position, and returning the end effector from the second position to the first position. The end effector is moved between the first position and the second position along a first path to axially translate a substrate on the end effector through an opening of the substrate holding chamber. The substrate is axially translated along the first path. The end effector is returned from the second position through the opening of the substrate holding chamber to the first position along a second path. A portion of the second path extending through the opening of the substrate holding chamber is different than a comparable portion of the first path extending through the opening of the substrate holding chamber.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
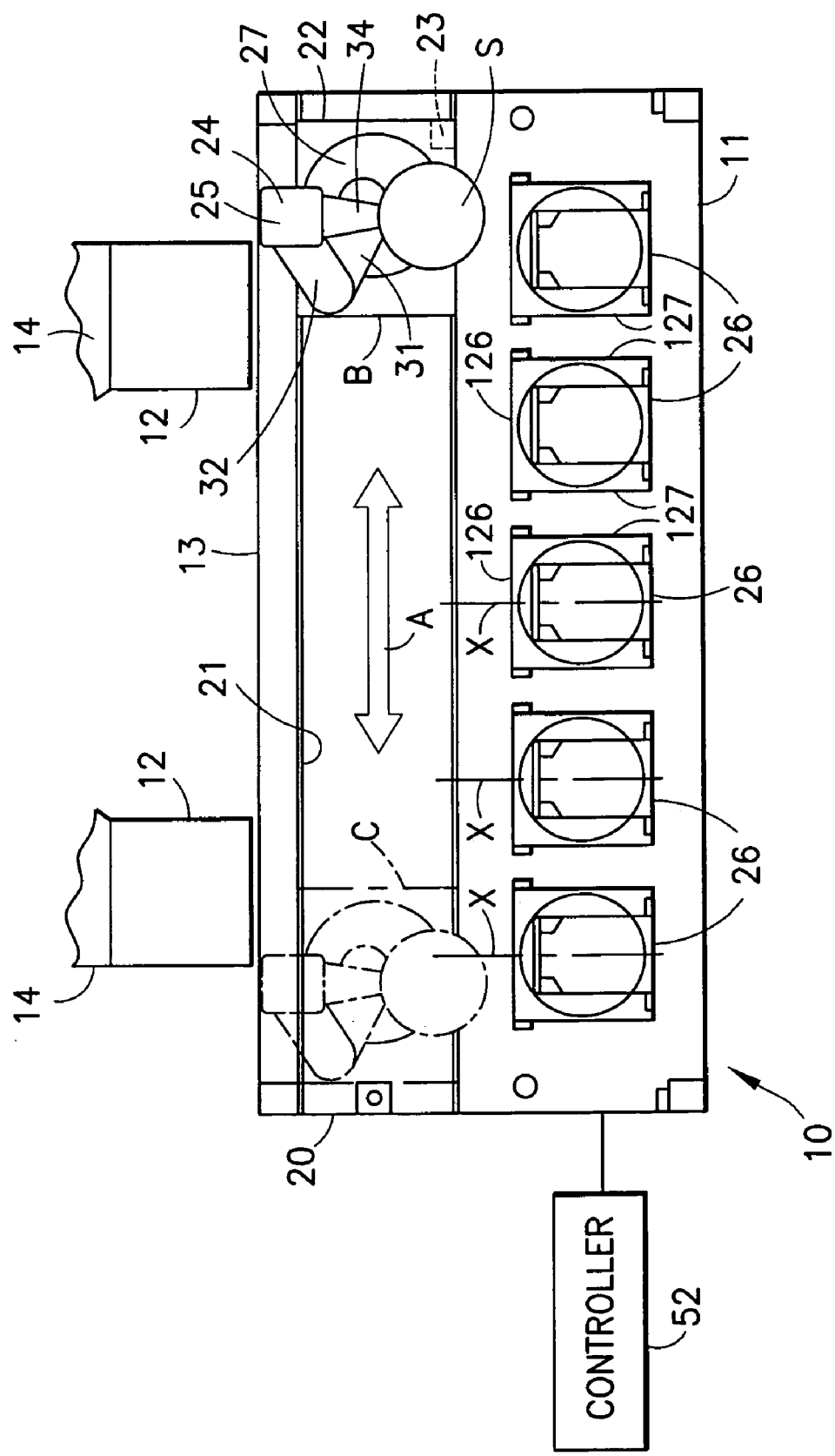
FIG. 1 is a schematic top plan view of an apparatus for transporting substrates into and out of a processing device, wherein the apparatus incorporates features of the present invention.

Referring to FIG. 1, there is shown a schematic top plan view of an apparatus 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

The apparatus 10 is shown connected to load locks 12 of a substrate processing device 14. The processing device 14 is adapted to process substrates such as semiconductor wafers as is known in the art. Examples of substrate processing devices are described in U.S. Pat. Nos. 4,715,921 and 5,512,320 which are hereby incorporated by reference in their entireties. In alternate embodiments, the apparatus 10 could be configured to work with any suitable type of substrate processing device. The apparatus 10 generally comprises a frame 20, a car 22, a robot 24, a controller 52 and substrate cassettes 26. The apparatus 10 is adapted to move substrates, such as semiconductor wafers or flat panel display substrates, between the cassettes 26 and the load locks 12. The apparatus 10 employs the robot 24 to individually remove substrates from the cassettes 26 and insert the substrates into the load locks 12. When the processing device 14 finishes processing the substrates, the apparatus 10 is used to return the substrates from the load locks 12 to the cassettes 26. The apparatus 10 operates in atmospheric pressure, but could be used in other pressure conditions, including a vacuum. The apparatus 10 is adapted to hold a number of the cassettes 26.

Figure 5:
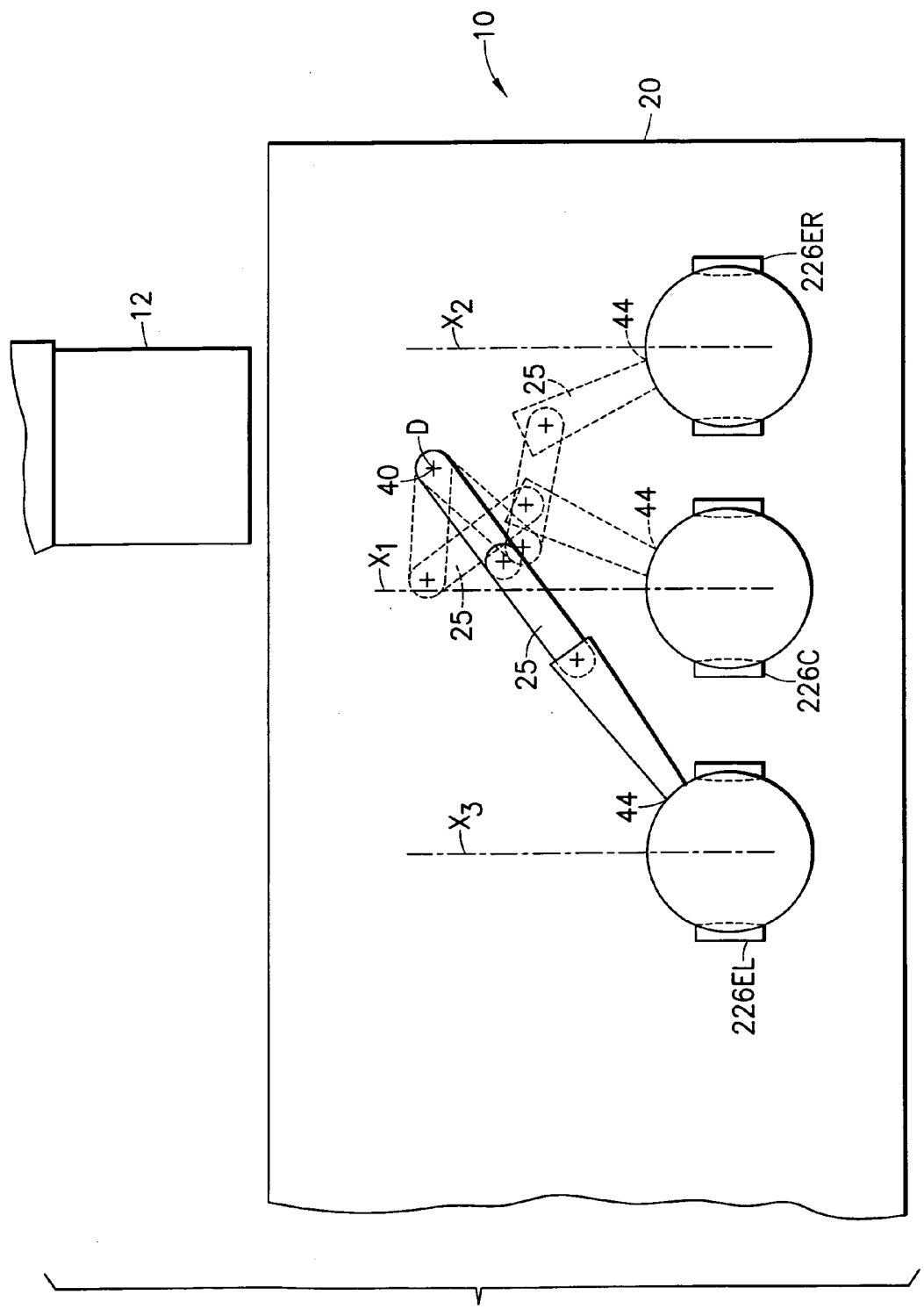
FIG. 5 is a partial schematic top plan view of the apparatus shown in FIG. 1, showing the movable arm assembly extended in three different positions corresponding to three different substrate storage areas.

The frame 20 is fixedly attached to the load locks 12 with the rear 13 of the frame 20 facing the front ends of the load locks 12. The frame 20 is adapted to removably support the cassettes 26 thereon. FIG. 1 shows the frame 20 supporting cassettes 26 which are used for holding 200 mm semiconductor wafers. Referring also to FIG. 5, the frame 20 of the apparatus 10 may also support a second type of cassettes such as "open" cassettes 226 for holding 300 mm semiconductor wafers. The cassettes 26 for 200 mm wafers may hold thirteen or twenty-six semiconductor wafers. As shown in FIG. 1, each cassette 26 has a substrate access opening in the front 126 of the cassette 26. Substrates are transported into and out of the cassettes 26 through the front access opening along an axis X orientated substantially parallel to the sides 127 of the cassette 26. The cassettes are arranged generally side by side near the front 11 of the frame 20. The substrate access openings 126 of the cassettes 26 face in the same direction, towards the rear 13 of the frame 20. Thus, the axes X along which the substrates are transported into and out of the respective cassettes 26 are aligned substantially parallel to each other. At the rear 13 of the frame 20, a track area 21 extends the length of the frame 20. The car 22 is movably mounted on the track area 21 of the frame to move or roll between positions B and C along pathway A. A car drive mechanism 23 drivingly connects the car to the frame 20. The drive mechanism 23 is controlled by the controller 52 to controllably move the car 22 to different positions along the track area 21. One such car drive mechanism is described in U.S. patent application Ser. No. 08/891,523, filed Jul. 11, 1997 entitled "Robot Arm Relocation System" which is hereby incorporated by reference in its entirety. In alternate embodiments other types of robot arm relocation systems could be used. For example, the robot arm may be rotatably mounted on a single axis of rotation.

Figure 2A:
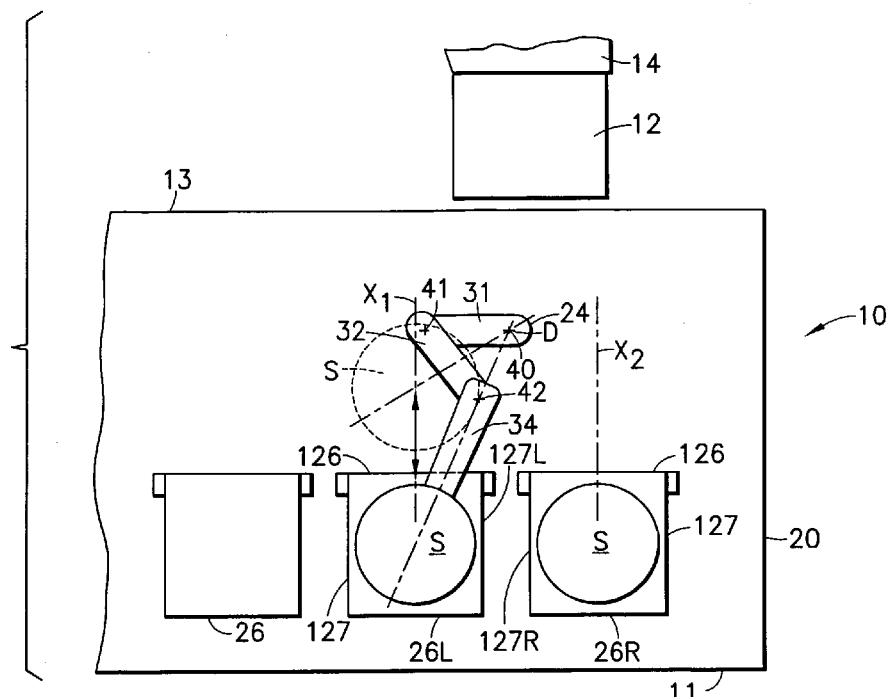
FIGS. 2A–2B are a first pair of partial schematic top plan views of the apparatus shown in FIG. 1, showing a movable arm assembly in two positions when the arm assembly moves substrates held by the arm assembly into and out of a first substrate storage area.

The robot 24 is mounted to the car 22. Thus, the robot 24 moves with the car 22. The robot 24 generally comprises a movable arm assembly 25 and a drive section 27. In the preferred embodiment, the drive section 27 connects the movable arm assembly 25 to the car 22, though in alternate embodiments, the arm assembly may be mounted directly to the car with the drive section depending from the arm assembly. The drive section 27 is connected to the movable arm assembly 25 to independently rotate the arm assembly as a unit about a single axis of rotation and also to extend and retract the arm assembly 25. Furthermore, the drive section 27 can move the arm assembly 25 up and down relative to the frame 20 to vertically position the arm assembly as required. The arm assembly 25 is shown in a retracted position in FIG. 1. When the arm assembly 25 is extended it can have its end effector positioned inside the load locks 12 or cassettes 26 to pick-up or drop-off a substrate (see FIGS. 2A and 3A).

Figure 4:
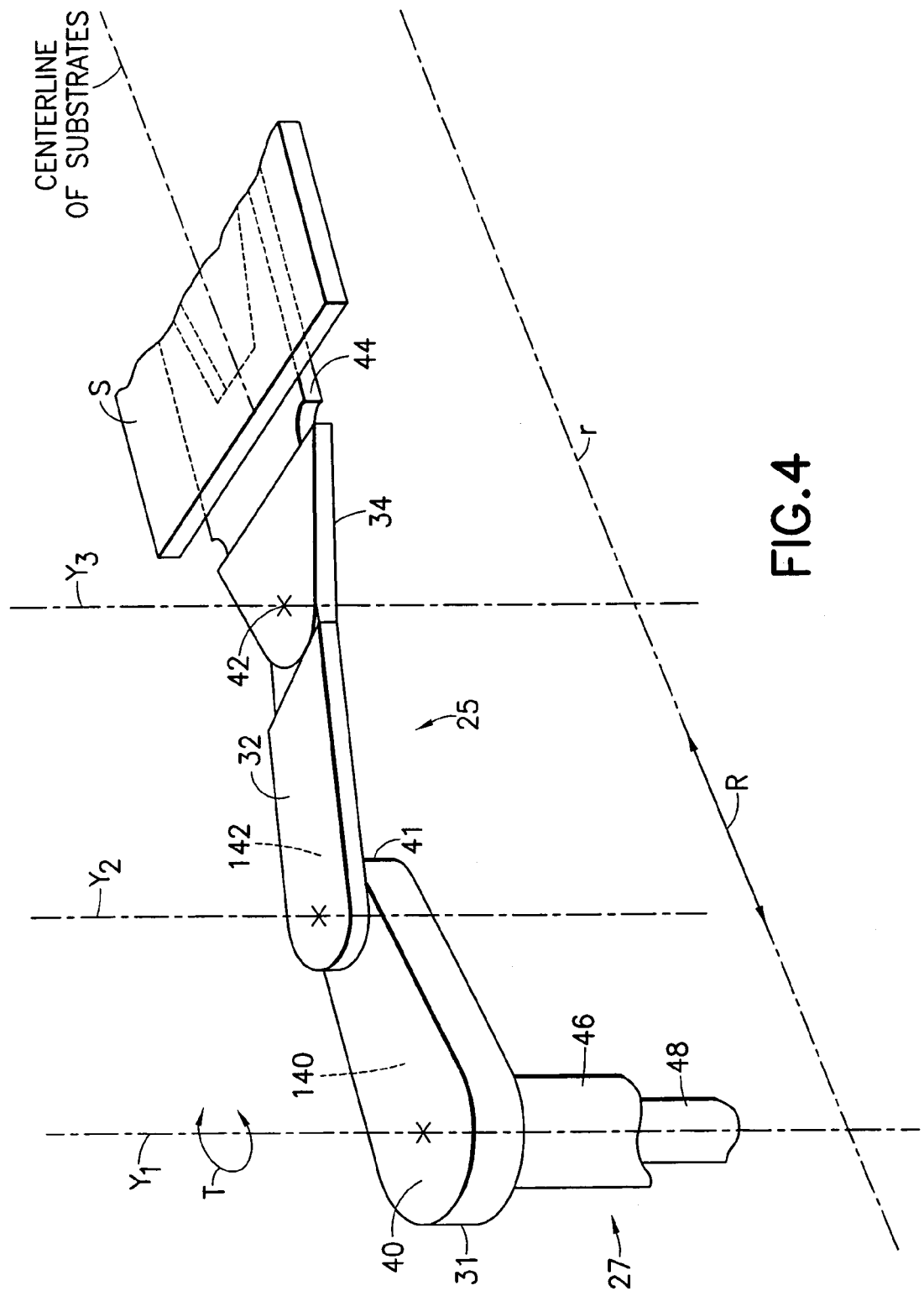
FIG. 4 is a schematic perspective view of the movable arm assembly of the apparatus shown in FIG. 1.

Referring now to FIG. 4, there is shown a schematic perspective view of the movable arm assembly 25. In the embodiment shown, the arm assembly is an articulated arm assembly, such as disclosed in U.S. Pat. No. 5,431,529 or U.S. Pat. No. 5,765,983 which are hereby incorporated by reference in their entireties. The arm assembly 25 generally has three arm sections connected in series including an upper arm 31, a forearm 32, and a wrist extension 34. The upper arm 31 supports the arm assembly 25 from the drive section 27. The wrist extension 34 is connected to the upper arm 31 by the forearm 32 and includes an end effector section 44 at its distal end. The upper arm 31 of the movable arm assembly 25 is mounted to the drive section 27 to rotate about a vertical axis of rotation Y1 at the shoulder 40 of the arm assembly. The forearm 32 is pivotably mounted to the upper arm 31 to form an elbow 41 of the arm assembly 25. The forearm 32 rotates relative to the upper arm 31 about a vertical axis of rotation Y2 at the elbow 41 of the movable arm assembly 25. Opposite the elbow 41, the forearm 32 is pivotably connected to the wrist extension 34 to form a wrist 42 of the arm assembly. The wrist extension 34 rotates relative to the forearm 32 about a vertical axis of rotation Y3 at the wrist 42. In the preferred embodiment, the end effector section 44 is located on the wrist extension 34 to hold a substrate S with its center generally aligned with a radial axis r. The radial axis r extends through the axes of rotation Y1, Y3 at the shoulder 40 and wrist 42 (see FIG. 4). In alternate embodiments, the end effector may be located so that the center of the substrate held by the end effector is offset to the radial connecting the axes of rotation at the shoulder and wrist.

Drive sections for actuating articulated arms are known in the art. The drive section 27, in the preferred embodiment, may be of a type which includes two co-axially mounted drive shafts 46, 48, although any other suitable drive system may be used. The co-axial drive shafts 46, 48 are located to spin on the axis of rotation Y1 at the shoulder 40 of the movable arm assembly 25. The upper arm 31 is fixedly mounted to the first drive shaft 46 to turn in unison with the shaft 46 about the axis Y1 at the shoulder 40. The second drive shaft 48 is operably connected by a transmission system 140 to the forearm 32 to rotate the forearm about the axis of rotation Y2 at the elbow 41 of the arm assembly 25. In the preferred embodiment, the transmission system is located inside the upper arm 40. The drive shaft to forearm transmission 140 may include a link and crank or otherwise a belt and pulley system imparting the rotation of the second drive shaft 48 to rotate the forearm 32 about the elbow 41. In an alternate embodiment, the transmission system may be located outside the upper arm. In another alternate embodiment, the drive shaft for rotating the forearm about the elbow may be located to directly drive the rotation of the forearm (e.g. the second drive shaft may be mounted to the upper arm at the elbow with the forearm directly mounted to the second drive shaft). The wrist extension 34 is operably connected to the forearm 32 by an elbow to wrist transmission system 142 which synchronously counter-rotates the wrist extension 34 about the axis of rotation Y3 at the wrist 42 in response to rotation of the forearm about the elbow 41. In the preferred embodiment, the elbow to wrist transmission system 142 is generally located inside the forearm 32. The elbow to wrist transmission system may comprise a link and offset crank or a belt and pulley system connecting the forearm 32 to the wrist extension 34 so that rotation of the forearm about the elbow 41 in one direction rotates the wrist extension 34 about the wrist 42 in an opposite direction. For example, clockwise rotation of the forearm 32, about the elbow 41 results in the wrist extension 32 rotating counter-clockwise about the wrist 42, and conversely, counter-clockwise rotation of the forearm 31 about the elbow 41 drives the wrist extension clockwise around the wrist 42. Thus, the rotation of the wrist extension 34 about the wrist 41 is slaved to the rotation of the forearm 31 about the elbow 41.

The drive section 27 is capable of independently turning the drive shafts 46, 48 in either direction at various rates of rotation. The controller 52 controls the direction and rate of rotation of the two drive shafts 46, 48 to manipulate the movable arm assembly 25. To rotate the movable arm assembly 25 as a unit about the axis of rotation Y1 at the shoulder 40, both drive shafts 46, 48 are rotated in unison. (e.g. To rotate the arm 25 clockwise about the shoulder 40, both shafts 46, 48 are rotated clockwise in unison.) Rotation of both shafts 46, 48 in unison rotates the arm assembly 25 as a unit about the shoulder 40 because there is no relative rotation between the upper arm 31 and the forearm 32. This rotation, indicated by the arrows T on FIG. 4, of the movable arm assembly 25 as a unit about the shoulder 40 is otherwise know as "T" movement of the movable arm assembly 25. Extension and retraction of the movable arm assembly 25 to displace the wrist 42 relative to the shoulder 41 substantially along a radial axis (a movement otherwise know as "R" movement of the arm assembly) is accomplished by counter-rotating the drive shafts 46, 48. Counter-rotation of the drive shafts 46, 48 in turn causes relative rotation between the upper arm 31 and forearm 32 and hence displacement of the wrist 42 relative to the shoulder 40. (e.g. In the embodiment shown, with the movable arm assembly 25 in an extended position, clockwise rotation of shaft 46 rotates the upper arm 31 clockwise about the shoulder 40, and counter-clockwise rotation of shaft 48 rotates the forearm 32 counter-clockwise about the elbow 41 thereby moving the wrist 42 towards the shoulder.) Counter-rotating the drive shafts 46, 48 at the same rate moves the wrist 42 relative to the shoulder 40 generally along a single radial axis as indicated by the arrows R in FIG. 4. As described previously, the rotation of the forearm 32 about the elbow 41 automatically counter-rotates the wrist extension 34 about the wrist 42. The elbow to wrist transmission synchronously counter-rotates the wrist extension 34 relative to the forearm 32 to maintain the center of a substrate held by the end effector section 44 substantially aligned with the wrist 42 on the radial axis along which the wrist 42 is being translated during extension or retraction (i.e. "R" type movement) of the movable arm assembly 25.

Figure 3A:
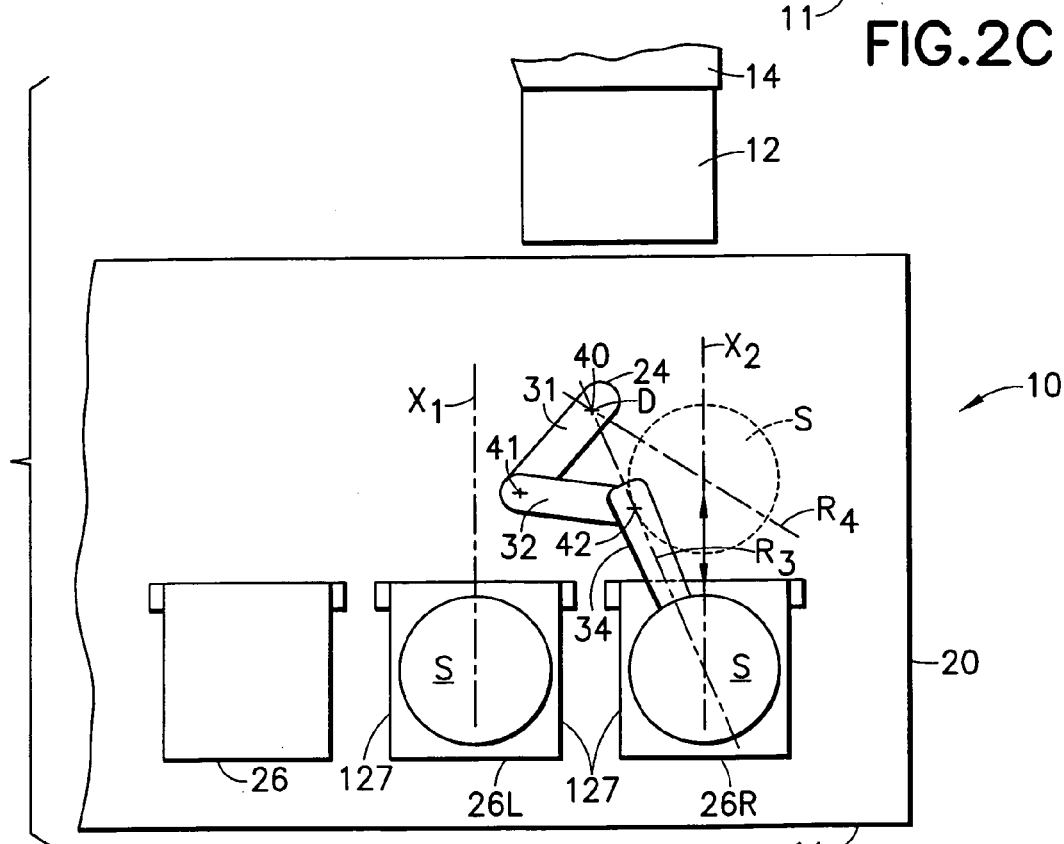
FIGS. 3A–3B are a second pair of partial schematic top plan views of the of the apparatus shown in FIG. 1, showing the movable arm assembly in two positions when the arm assembly moves substrates held by the arm assembly into and out of a second substrate storage area.
Figure 3B:
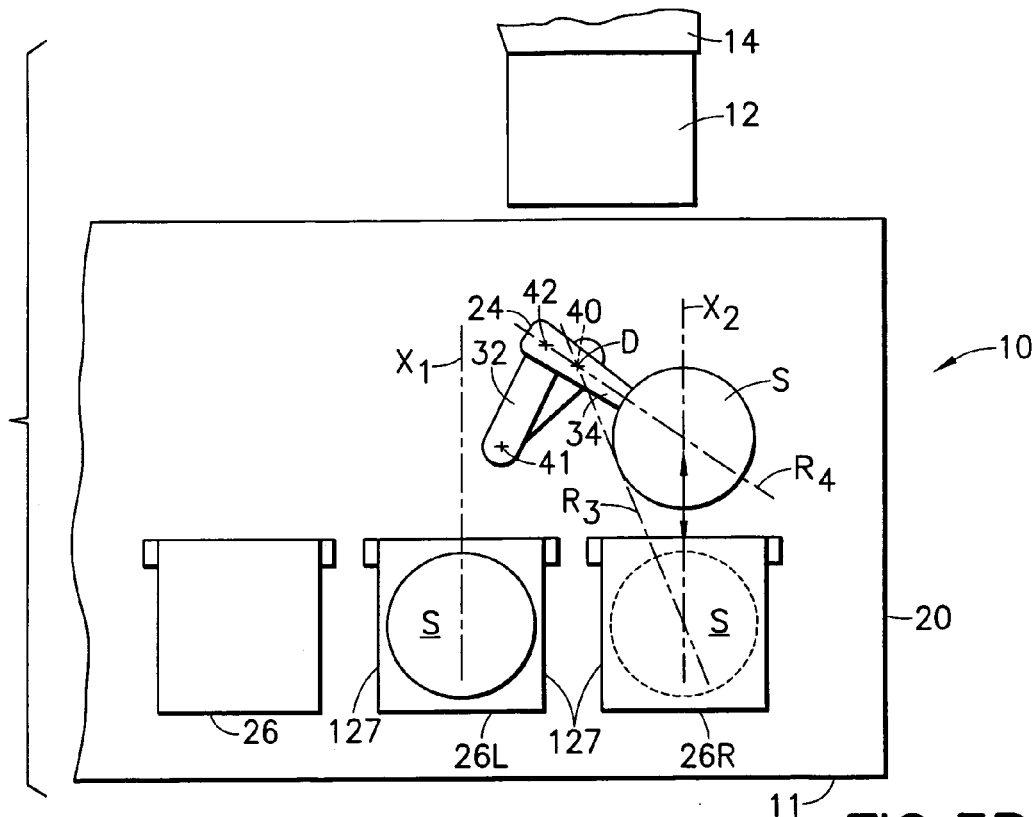
Figure 3C:
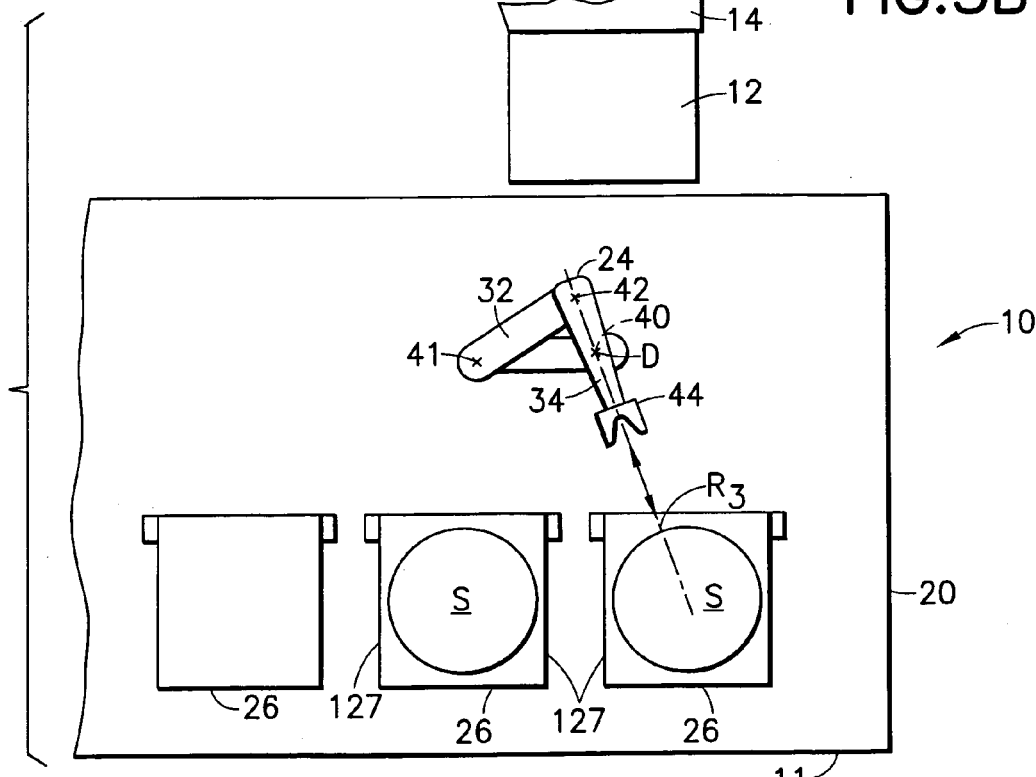
FIG. 3C is yet another partial schematic top plan view of the apparatus shown in FIG. 1, showing the movable arm assembly in a third position when the arm moves into and out of the second substrate storage area without holding a substrate.

The controller 52 also controls the drive section to substantially simultaneously rotate and extend or retract the movable arm assembly 25 in a compound "R" and "T" movement of the arm assembly. To achieve the compound "R" and "T" movement of the movable arm assembly 25, the drive shafts 46, 48 are rotated at dissimilar rates. The dissimilar rates of rotation of the drive shafts result in dissimilar rates of rotation of the upper arm 31 and the forearm 32 which brings about rotation of the movable arm assembly 25 about the shoulder 40 (i.e. "T" movement) compounded with extension/retraction of the arm assembly (i.e. "R" movement). The elbow to wrist transmission system which automatically counter-rotates the wrist extension 34 relative to the rotation of the forearm 32, maintains the wrist 42 and the center of the substrate on the end effector section 44 generally aligned on an axis intersecting the axis of rotation Y1 at the shoulder 40. In other words, as the wrist 42 is rotated about the shoulder 40 by the compound "R" and "T" movement of the movable arm assembly 25, the wrist extension 34 is automatically rotated about the wrist 42 so that the center of the substrate S on the end effector 44 rotates about the shoulder 40 at substantially the same rate as the wrist 42, and hence, the center of the shoulder 40, the center of the wrist 42 and the center of the substrate S on the end effector 44 are points that generally remain co-linear. For example, when the arm assembly 25 is extended as shown in FIG. 3A, the wrist 42 and center of the substrate S held by the end effector are generally aligned with radial axis R3 which extends through the shoulder 40. When the arm assembly 25 is retracted as shown in FIG. 3B, the wrist 42 and center of the substrate S are generally aligned with radial axis R4 which again extends through the shoulder 40.

Figure 2B:
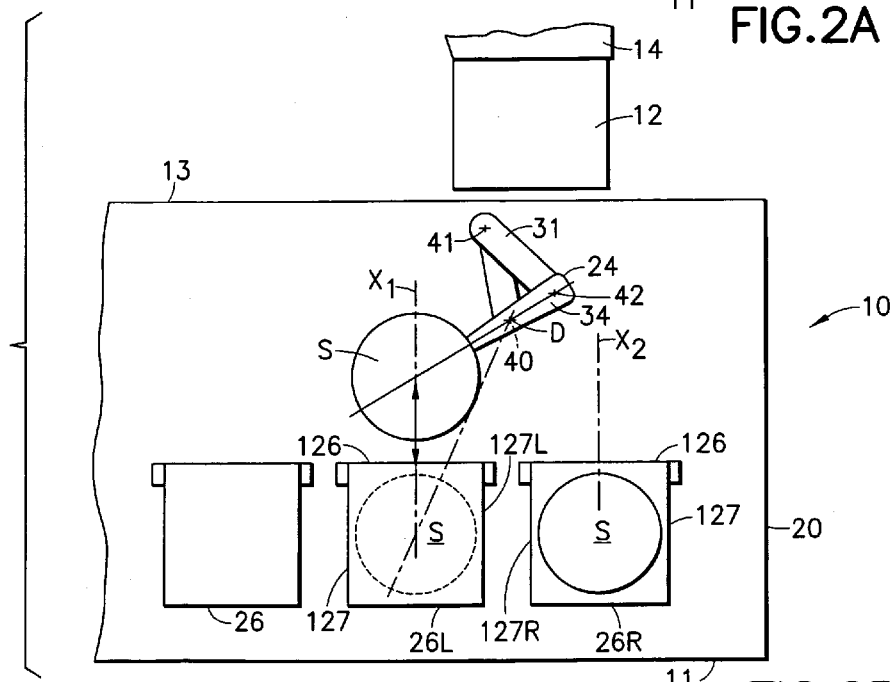
Figure 2C:
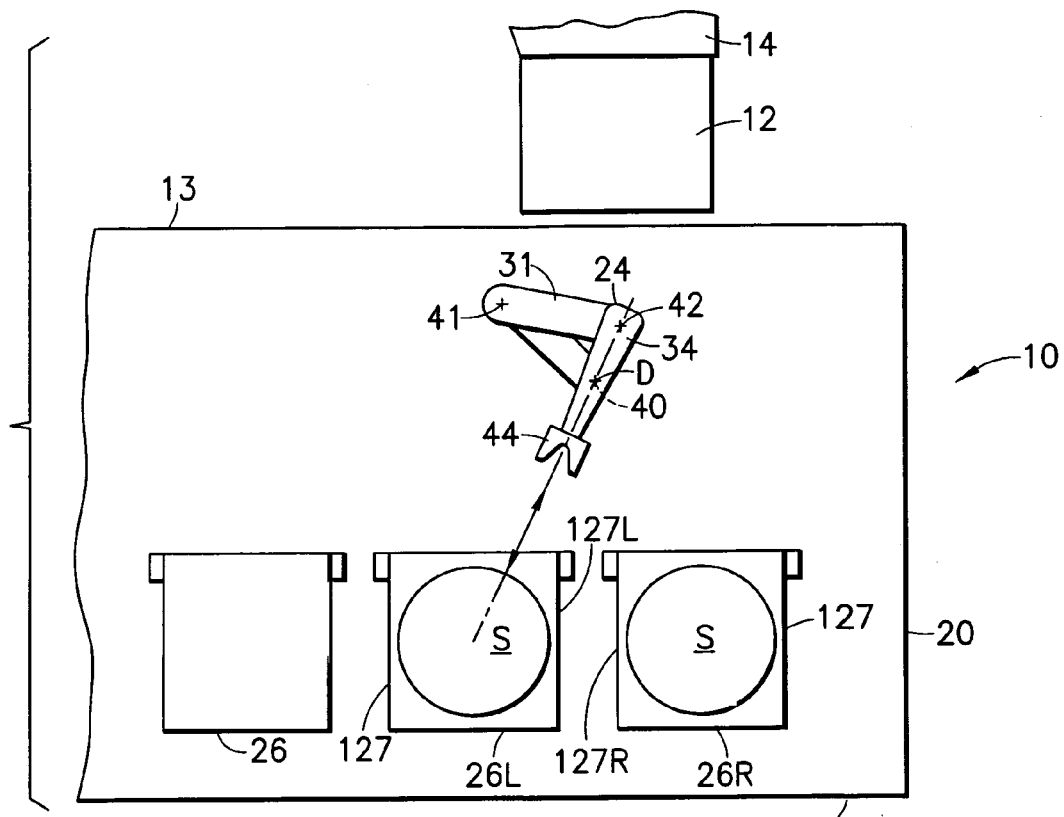
FIG. 2C is another partial schematic top plan view of the apparatus shown in FIG. 1, showing the movable arm assembly in a third position when the arm moves into and out of the first substrate storage area without holding a substrate.

The procedure for moving substrates between the cassettes 26 and the load locks 12 is substantially as follows. Referring also to FIGS. 2A–2C and 3A–3C, the first step of the procedure is to move the car 22 to place the shoulder 40, and hence the axis of rotation Y1 about which the movable arm assembly 25 rotates, at position D. Position D is located between the cassettes 26L, 26R. When the shoulder 40 of the arm assembly 25 is located at position D, the respective axes X1, X2 along which substrates are moved into and out of the two side by side cassettes 26L, 26R extend on both sides of the shoulder 40. After moving the movable arm assembly 25 to locate its shoulder 40 at position D, the arm assembly 25 is articulated to insert the end effector 44 into one of the side by side cassettes 26L, 26R to capture a substrate. With the shoulder 40 located at position D, the movable arm assembly 25 can be articulated to insert the end effector 44 into either of the two cassettes 26L, 26R without relocating the shoulder 40 relative to the cassettes. To insert the end effector 44 into the cassette 26L, 26R in the preferred embodiment, the controller 52 first rotates the arm entire assembly 25 as a unit about the shoulder 40 ("T" movement) to radially align the wrist 42 with the opening of the cassette 26L, 26R, (see FIGS. 2C and 3C) and after the "T" movement is complete, extends the arm assembly 25 substantially along the radial ("R" movement) to insert the end effector 44 into the cassette 26L, 26R. In this embodiment, the location of the inner sides 127L, 127R (see FIG. 2) of cassettes 26L, 26R relative to the shoulder 40 at position D is such that the sides 127L, 127R do not interfere with translating the end effector 44 substantially along a single radial into the cassettes 26L, 26R. In alternate embodiments, where the location of the inner sides of the cassettes interfere with the "R" movement of the arm assembly 25, the end effector 44 is inserted into the cassettes by translating the end effector relative to the cassettes along an axis at a small angle relative to substrate removal/insertion axis X1, X2 corresponding to the particular cassette. This is accomplished by the controller 52 moving the arm assembly 25 in a compound "R" and "T" movement to provide a straight X axis movement of the center of the end effector 44. With the end effector 44 in the cassette 26L, 26R, the end effector 44 then captures a substrate S. Once the substrate S is captured by the end effector 44, the movable arm assembly 25 is articulated to remove the substrate S from the cassette 26L, 26R. The substrate S held by the end effector 44 is removed from the cassette 26L, 26R substantially along the corresponding substrate removal axis X1, X2. Thus, removal of the substrate S is along a different path then the insertion path of the end effector 44 into the cassette 26L, 26R (see FIGS. 2B–2C and 3B–3C). To move the substrate S on the end effector 44 substantially along axis X1, X2, the movable arm assembly 25 is moved in a compound "R" and "T" movement (see FIGS. 2A–2B and 3A–3B). The controller 52 controls the turn rate and direction of the two drive shafts 46, 48 to move the arm assembly 25 in a compound "R" and "T" movement which results in the substrate S being removed from the cassette 26L, 26R substantially along axis X1, X2. After the substrate S is out of the cassette 26L, 26R, the movable arm assembly 25 transports the substrate S into the load lock 12. If, as shown in FIGS. 2B and 3B, the position D of the shoulder 40 is substantially in front of the load lock 12, the shoulder 40 stays in place in position D and the arm assembly 25 moves the substrate S by undergoing a series of "T" movements and "R" movements. If position D of the shoulder 40 is not substantially in front but rather adjacent to the load lock 12, then the movable arm assembly 25 moves the substrate S into the load lock by undergoing a compound "R" and "T" movement with the shoulder staying in position D. Otherwise, to transport the substrate S into the load lock 12, the car 22 moves the shoulder 40 of the movable arm assembly 25 from position D to a different position to allow the arm assembly to insert the substrate into the load lock 12. Subsequent to the release of the substrate S in the load lock 12, the movable arm assembly 25 returns the end effector 44 to the cassette 26L, 26R as described above. The above sequence of steps is repeated as required until the cassette 26L, 26R is unloaded. In addition, the transfer of substrates between cassettes 26L, 26R and a load lock 12 need not be done one cassette at a time, because as noted previously, from position D, the movable arm assembly 25 may move substrates into and out of either the cassette 26L on the left or the cassette 26R on the right.

Thus, during unloading of the cassettes, substrates may be removed sequentially from both the left and right cassettes 26L, 26R without relocating the shoulder 40 from position D. Alternatively, substrates may be removed from one cassette 26L, 26R on the first half of the transport cycle of the arm assembly 25 and different (i.e. processed) substrates may be returned to the adjoining cassette 26R, 26L on the return or second half of the transport cycle with the shoulder 40 of the arm assembly 25 staying in position D.

When returning substrates to their respective cassette 26L, 26R with the shoulder 40 of the arm assembly 25 located in position D, the substrate S held on the end effector 44 of the arm assembly 25 is also inserted into the cassette 26L, 26R substantially along axis X1, X2. To move the substrate S into the cassette 26L, 26R substantially along axis X1, X2, the arm assembly 25 again performs a compound "R" and "T" movement substantially in reverse to the compound "R" and "T" movement performed to remove the substrate from the cassette along axis X1, X2 (see FIGS. 2A–2B and 3A–3B). After the substrate S is released by the end effector 44 in the cassette 26L, 26R the end effector 44 is withdrawn from the cassette by merely retracting the arm assembly ("R" movement only). Thus, withdrawal of the end effector 44 after release of a substrate is along a different path than the insertion path of the substrate into the cassette 26L, 26R (see FIGS. 2B–2C and 3B–3C) FIGS. 2A–2C and 3A–3C show the movable arm assembly 25 moving substrates into and out of two cassettes 26L, 26R located at a side of the frame 20 of the apparatus, though the procedure and movements of the arm assembly 25 when moving substrates into and out of any two side by side cassettes 26 is substantially the same as shown in FIGS. 2A–2C and 3A–3C and as described above.

Referring now to FIG. 5, the movable arm assembly 25 may also be used for moving substrates between three side by side "opens" cassettes 226 and the load lock 12 when the arm 25 is located with its shoulder 40 (i.e. its axis of rotation Y1) at position D. As noted previously, the "open" cassettes 226 are generally used for holding 300 mm semiconductor wafers. The shoulder 40 of the movable arm assembly 25 at position D is located between two of the cassettes 226 in generally in front of the load lock 12. For example, FIG. 5 shows that the shoulder 40 (i.e. position D) is located between the center cassette 226C and the right outer cassette 226ER. FIG. 5 shows the movable arm assembly 25 extended in three different positions with the end effector 44 located in each of the three cassettes 226EL, 226C, 226ER. The procedure for moving the substrates between the three cassettes 226EL, 226C, 226ER and load locks 12 is substantially similar to the procedure described previously for moving substrates from two side by side cassettes 26L, 26R as shown in FIGS. 2A–2C and 3A–3C. Once the movable arm assembly 25 is placed with its shoulder 40 in position D, the movable arm assembly is articulated in a compound "R" and "T" movement to move the substrate into and out of its corresponding cassette 226EL, 226C, 226ER substantially along the corresponding removal/insertion axis X3, X4, X5. Insertion and removal of the end effector 44 from the respective cassettes 226EL, 226C, 226ER may be either along a radial axis extending between the corresponding cassette 226EL, 226C, 226ER and the shoulder 40 of the arm assembly 25 or along an axis at a small angle to the removal/insertion axis X3, X4, X5 of the cassette.

In the prior art, robots of substrate transport apparatus moved substrates into and out of cassettes by locating the shoulder of the movable arm assembly directly in front of the cassette and moved the substrate by pure extension or retraction of the arm assembly (i.e. only "R" movement of the arm assembly). This required that the robot be relocated to the front of each cassette when a substrate was to be moved into or out of that particular cassette. The additional time required to relocate the arm assembly reduced the throughput of the apparatus of the prior art. Otherwise, the movable arm assembly of the robots in the prior art were provided with a separate and independent drive system to independently rotate the wrist extension of the movable arm assembly about the wrist which enabled these types of arm assemblies to move substrates into and out of cassettes without having to position the shoulder of the arm directly in front of the cassette. However, the additional drive system required for the wrist extension of the arm assemblies increased the complexity and cost of the transport apparatus of the prior art. The present invention solves the problems of the prior art by allowing the movable arm assembly 25 to move substrates into and out of cassettes 26 without having to relocate the movable arm assembly 25 to the front of each cassette from or into which the substrates are being moved and without an additional independent drive system dedicated to independently rotate the wrist extensions about the wrist.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for transporting substrates into and out of a substrate holding chamber comprising the steps of:
    placing an end effector of a transport arm in a first position;
    moving the end effector between the first position and a second position along a first path to axially translate a substrate on the end effector through an opening of the substrate holding chamber, the substrate being axially translated along the first path; and
    returning the end effector from the second position through the opening of the substrate holding chamber to the first position along a second path, a portion of the second path extending through the opening of the substrate holding chamber being different than a comparable portion of the first path extending through the opening of the substrate holding chamber.

2. A method as in claim 1, wherein the portion of the second path extending through the opening of the substrate holding chamber is generally described by a portion of an axis connecting a pivot axis of the transport arm at a shoulder of the transport arm to the substrate holding chamber.

3. In a substrate processing apparatus comprising a frame with a plurality of side by side substrate storage areas, a robot transport arm pivotably mounted to the frame to transport substrates between the substrate storage areas and a substrate holding area, the robot transport arm having an end effector and a wrist, the end effector being pivotably mounted to the wrist of the robot transport arm, and a controller controllably connected to the robot transport arm wherein the improvement comprises:
    the controller being programmed to control the robot transport arm for substantially rectilinearly moving substrates into and out of at least two of the plurality of side by side substrate storage areas along axes of translation corresponding to each of the two substrate storage areas, and for moving the end effector without substrates into and out of at least one of the two storage area along a different path than the axis of translation corresponding to the storage area,
    wherein an axis about which the robot transport arm pivots relative to the frame stays in one location relative to the frame both when the robot transport arm moves substrates into and out of each of the two substrate storage areas, and when the end effector is moved without substrates into the at least one of the two substrate storage areas, and
    wherein the end effector is slaved to the robot transport arm to rotate automatically about the wrist when the robot transport arm moves substrates into and out of each of the substrate storage areas.

4. A substrate transport apparatus as in claim 3, wherein when the robot transport arm moves substrates into and out of each of the two substrate storage areas, the axis about which the robot transport arm pivots is located between the axes of translation of the two substrate storage areas.

5. A substrate transport apparatus as in claim 3, wherein the two axes of translation of the two substrate storage areas are substantially parallel to each other.

6. A substrate transport apparatus as in claim 3, wherein the robot transport arm is an articulated arm comprising an upper arm and a lower arm, the upper arm being independently rotatable about the axis about which the robot transport arm pivots and the lower arm being independently rotatable relative to the upper arm.

7. A substrate transport apparatus comprising:
    a robot transport arm with an end effector to hold a substrate thereon;
    means for rotating the robot transport arm about a first axis of rotation, the means for rotating the robot transport arm comprising a first drive mechanism being drivingly connected to the robot transport arm to rotate the robot transport arm as a unit about the axis of rotation;
    means for linearly displacing the end effector of the robot transport arm, the means for displacing the end effector comprising a second drive mechanism drivingly connected to the robot transport arm to substantially radially displace the end effector relative to the axis of rotation; and
    a controller controlling the means for rotating the robot transport arm and the means for displacing the end effector to provide compound rotation of the robot transport arm about the axis of rotation with radial displacement of the end effector relative to the axis of rotation resulting in general rectilinear translation of the substrate from an initial position to a final position along a first path through a transport opening in the substrate holding chamber;
    wherein the controller controls the means for rotating and the means for displacing for returning the end effector from the final position along a second path through the opening in the substrate holding chamber, the second path being different than the first path.

8. A method for transporting a substrate into and out of a substrate holding area on a substrate processing apparatus comprising the steps of:
    providing the substrate on an end effector of a transport arm, the end effector being rotatably mounted to a wrist of the transport arm;

rotating the transport arm about an axis of rotation at a shoulder of the transport arm to rotate the wrist about the axis of rotation; and moving the transport arm to radially displace the wrist of the transport arm relative to the axis of rotation at the shoulder of the transport arm, wherein the step of moving the transport arm rotates the end effector about the wrist to rotate the substrate about the axis of rotation at the shoulder of the transport arm in concert with rotation of the wrist about the axis of rotation at the shoulder of the transport arm, wherein the movement and rotation of the transport arm result in the substrate on the end effector being displaced from an initial position to a final position along a first path through a substrate transport passage of the substrate holding area, and wherein the end effector is returned to the initial position along a second path through the substrate transport passage, the second path being different than the first path.

9. A method as in claim 8, wherein the end effector is returned to the initial position without the substrate.

10. A method as in claim 8, wherein the substrate processing apparatus comprises at least three of the substrate holding areas located side by side to each other, the transport arm transporting substrates into and out of each of the three substrate holding areas, and wherein the axis of rotation at the shoulder of the transport arm stays in one location relative to the three substrate holding areas when the transport arm transports substrates into and out of each of the three substrate holding areas.

* * * * *